(12) United States Patent
Basceri et al.

(10) Patent No.: US 6,838,122 B2
(45) Date of Patent: Jan. 4, 2005

(54) CHEMICAL VAPOR DEPOSITION METHODS OF FORMING BARIUM STRONTIUM TITANATE COMPRISING DIELECTRIC LAYERS

(75) Inventors: Cem Basceri, Boise, ID (US); Nancy Alzola, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/905,286

(22) Filed: Jul. 13, 2001

(65) Prior Publication Data

US 2003/0017265 A1 Jan. 23, 2003

(51) Int. Cl.⁷ .............................................. C23C 16/06
(52) U.S. Cl. ........................ 427/255.36; 427/255.32; 427/255.26
(58) Field of Search ................. 427/255.15, 255.19, 427/255.23, 126.3, 255.31, 255.32, 255.36, 255.7; 438/3, 785

(56) References Cited

U.S. PATENT DOCUMENTS

| | | | | |
|---|---|---|---|---|
| 4,105,810 A | * | 8/1978 | Yamazaki et al. | 427/255.32 |
| 5,006,363 A | * | 4/1991 | Fujii et al. | 427/571 |
| 5,164,363 A | * | 11/1992 | Eguchi et al. | 505/447 |
| 5,183,510 A | * | 2/1993 | Kimura | 118/719 |
| 5,254,505 A | | 10/1993 | Kamiyama | |
| 5,256,455 A | | 10/1993 | Numasawa | |
| 5,459,635 A | | 10/1995 | Tomozawa et al. | 361/321.5 |
| 5,470,398 A | | 11/1995 | Shibuya et al. | |
| 5,596,214 A | | 1/1997 | Endo | 257/324 |
| 5,618,761 A | | 4/1997 | Eguchi et al. | 438/785 |
| 5,635,741 A | | 6/1997 | Tsu et al. | |
| 5,711,816 A | * | 1/1998 | Kirlin et al. | 118/726 |
| 5,731,948 A | | 3/1998 | Yializis et al. | |
| 5,776,254 A | | 7/1998 | Yuuki et al. | |
| 5,783,253 A | | 7/1998 | Roh | |
| 5,798,903 A | | 8/1998 | Dhote et al. | |

(List continued on next page.)

FOREIGN PATENT DOCUMENTS

| | | |
|---|---|---|
| EP | 0 474 140 A1 | 8/1991 |
| EP | 0 855 735 A2 | 1/1998 |
| EP | 0 957 522 A2 | 5/1999 |
| WO | WO 98/39497 | 2/1998 |
| WO | WO 99/64645 | 6/1999 |

OTHER PUBLICATIONS

Basceri, et al., "The dielectric response as a function of temperature and film thickness of fiber–textured (Ba,Sr)TiO, thin films grown by chemical vapor deposition", Journal of Appl. Phys. 82 (5), Sep. 1, 1997.

U.S. Appl. No. 09/652,907, Basceri et al., filed Aug. 31, 2000.

U.S. Appl. No. 09/776,217, Basceri, filed Feb. 2, 2001.

(List continued on next page.)

*Primary Examiner*—Timothy Meeks
*Assistant Examiner*—Eric B. Fuller
(74) *Attorney, Agent, or Firm*—Wells St. John P.S.

(57) ABSTRACT

The invention comprises a chemical vapor deposition method of forming a barium strontium titanate comprising dielectric layer. A substrate is positioned within a reactor. Barium and strontium are provided within the reactor by flowing at least one metal organic precursor to the reactor. Titanium is provided within the reactor. At least one oxidizer is flowed to the reactor under conditions effective to deposit a barium strontium titanate comprising dielectric layer on the substrate. In one implementation, the oxidizer comprises $H_2O$. In one implementation, the oxidizer comprises $H_2O_2$. In one implementation, the oxidizer comprises at least $H_2O$ and at least another oxidizer selected from the group consisting of $O_2$, $O_3$, $NO_x$, $N_2O$, and $H_2O_2$, where "x" is at least 1. In one implementation, the oxidizer comprises at least $H_2O_2$ and at least another oxidizer selected from the group consisting of $O_2$, $O_3$, $NO_x$, and $N_2O$, where "x" is at least 1.

10 Claims, 2 Drawing Sheets

U.S. PATENT DOCUMENTS

| | | | |
|---|---|---|---|
| 5,834,060 A | | 11/1998 | Kawahara et al. ........ 427/255.3 |
| 5,909,043 A | | 6/1999 | Summerfelt |
| 5,972,430 A | * | 10/1999 | DiMeo, Jr. et al. ...... 427/255.32 |
| 6,025,222 A | * | 2/2000 | Kimura et al. .............. 438/240 |
| 6,037,205 A | | 3/2000 | Huh et al. |
| 6,043,526 A | | 3/2000 | Ochiai |
| 6,046,345 A | | 4/2000 | Kadokura et al. |
| 6,078,492 A | | 6/2000 | Huang et al. |
| 6,090,443 A | | 7/2000 | Eastep |
| 6,126,753 A | | 10/2000 | Shinriki et al. ............. 118/715 |
| 6,127,218 A | * | 10/2000 | Kang ......................... 438/240 |
| 6,143,679 A | | 11/2000 | Nagasawa et al. |
| 6,146,907 A | | 11/2000 | Xiang et al. |
| 6,150,684 A | | 11/2000 | Sone |
| 6,153,898 A | | 11/2000 | Watanabe et al. |
| 6,156,638 A | | 12/2000 | Agarwal et al. |
| 6,165,834 A | | 12/2000 | Agarwal et al. |
| 6,211,096 B1 | | 4/2001 | Allman et al. |
| 6,236,076 B1 | | 5/2001 | Arita et al. |
| 6,238,734 B1 | * | 5/2001 | Senzaki et al. ............. 427/266 |
| 6,245,652 B1 | | 6/2001 | Gardner et al. ............. 438/592 |
| 6,258,170 B1 | | 7/2001 | Somekh et al. |
| 6,277,436 B1 | * | 8/2001 | Stauf et al. .............. 427/126.3 |
| 6,285,051 B1 | | 9/2001 | Ueda et al. |
| 6,323,057 B1 | | 11/2001 | Sone |
| 6,335,302 B1 | | 1/2002 | Satoh et al. |
| 6,337,496 B2 | | 1/2002 | Jung |
| 6,338,970 B1 | | 1/2002 | Suh |
| 6,362,068 B1 | | 3/2002 | Summerfelt et al. |
| 6,372,686 B1 | | 4/2002 | Golden |
| 6,422,281 B1 | | 7/2002 | Ensign, Jr. et al. |
| 6,500,487 B1 | * | 12/2002 | Holst et al. .............. 427/248.1 |
| 6,507,060 B2 | | 1/2003 | Ren et al. |
| 6,527,028 B2 | | 3/2003 | Miller |
| 6,566,147 B2 | * | 5/2003 | Basceri et al. ................. 438/3 |
| 6,602,376 B1 | | 8/2003 | Bradshaw |
| 2002/0197793 A1 | | 12/2002 | Dornfest et al. |
| 2003/0017266 A1 | | 1/2003 | Basceri et al. |
| 2003/0045006 A1 | | 3/2003 | Basceri et al. |

OTHER PUBLICATIONS

Dissertation: Cem Basceri, *Electrical and Dielectric Properties of (Ba,Sr)TiO₃ Thin Film Capacitory for Ultra–High Density* . . . , 171 pages (North Carolina State University 1997).

U.S. Appl. Ser. No. 09/388,063, Agarwal et al., filed Aug. 30, 1999.

U.S. Appl. No. 09/905,320, Basceri, filed Jul. 13, 2001.

U.S. Appl. No. 09/478,516, Basceri, filed Jan. 3, 2000.

U.S. Appl. No. 09/580,733, Basceri, filed May 26, 2000.

Steve Bilodeau et al., *Composition Dependence of the Dielectric Properties of MOCVD Ba$_x$Sr$_{1-x}$TiO$_3$*, pp. 1–21 (MRS Fall Meeting Dec. 1, 1994).

Steve M. Bilodeau et al., *MOCVD BST for High Density DRAM Applications* (Preprint for SEMICON/WEST Jul. 12, 1995), 2 pages.

Y–C Choi et al., Abstract, *Improvements of the Properties of Chemical–Vapor–Deposited (Ba$_1$Sr)TiO$_3$ Films Through Use of a Seed Layer*, 36 Jpn. J. Appl. Phys. Pt. 1, No. 11, pp. 6824–6828 (1997).

Chung Ming Chu et al., Abstract, *Electrical properties and crystal structure of (Ba$_1$Sr)TiO$_3$films prepared at low temperatures on a LaNiO$_3$electrode by radio–frequency magnetron* . . . , 70 Applied Physics Letters No. 2, pp. 249–251 (1997).

Kazuhiro Eguchi et al., Abstract, *Chemical vapor deposition of (Ba,Sr)TiO$_3$thin films for application in gigabit scale dynamic random access memories*, 14 Integrated Ferroelectrics No. 1–4, Pt. 1, pp. 33–42 (1997).

Q.X. Jia et al., Abstract, *Structural and dielectric properties of Ba$_{0.5}$Sr$_3$thin films with an epi–RuO$_2$bottom electrode*, 19 Integrated Ferroelectrics No. 1–4, pp. 111–119 (1998).

Takaai Kawahara et al., *(Ba, Sr)TiO$_3$Films Prepared by Liquid Source Chemical Vapor Deposition on Ru Electrodes*, 35 Jpn. J. Appl. Phys. Pt. 1, No. 9B, pp. 4880, 4883 (1996).

Rajesh Khamankar et al., *A Novel Low–Temperature Process for High Dielectric Constant BST Thin Films for ULSI DRAM Applications*, Microelectronics Research Center, Univ. of Texas at Austin, TX (Undated), 2 pages.

Yong Tae Kim et al., Abstract, *Advantages of RuO$_2$bottom electrode in the dielectric and leakage characteristics of (Ba$_1$Sr)TiO$_3$capacitor*, 35 Jpn. J. Appl. Phys. Pt. 1, No. 12A, pp. 6153–6156 (1996).

S.H. Paek et al., Abstract, *Characterization of MIS capacitor of BST thin films deposited on Si by RF magnetron .sputtering*, Ferroelectric Thin Films V. Symposium, San Francisco, CA, pp. 33–38 (Apr. 7, 1995).

N. Takeuchi et al., Abstract, *Effect of firing atmosphere on the cubic–hexagonal transition in Ba$_{0.99}$Sr$_{.01}$TiO$_3$*, 98 Nippon Seramikkusu Kyokai Gakujutsu Ronbunshi No. 8, pp. 836–839 (1990).

H. Yamaguchi, et al., Abstract, *Reactive coevaporation synthesis and characterization of SrTiO$_3$–BaTiO$_3$thin films*, IEEE International Symposium on Applications of Ferroelectrics, Greenville, SC, pp. 285–288 (Aug. 2, 1992).

S. Yamamichi et al., Abstract, *Ba + Sr/Ti ratio dependence of the dielectric properties for (Ba0.3 )Sr$_{0.3}$TiO$_3$thin films prepared by ion beam sputtering*, 64 Applied Physics Letters No. 13, pp. 1644–1646 (1994).

M. Yamamuka et al., Abstract, *Thermal–Desorption Spectroscopy of (Ba,Sr)TiO$_3$ Thin–Films Prepared by Chemical–Vapor–Depostion*, 35 Jpn. J. of Appl. Phys. Pt. 1, No. 2A, pp. 729–735 (1996).

Arai T., et al.: *Preparation of SrTiO$_3$ Films on 8–Inch Wafers by Chemical Vapor Deposition*, Jap. Journal of Applied Physics, vol. 35, No. 9B, Part 01, Sep. 1, 1996, pp. 4875–4879.

Kim, et al.: *Structural and Electrical Properties of BaTiO$_3$grown on p–InP (100) by low–pressure metalorganic chemical vapor deposition at low temperature*, Applied Physics Letters, US, American Institute of Physics vol. 65, No. 15, Oct. 10, 1994, pp. 1955–1957.

* cited by examiner

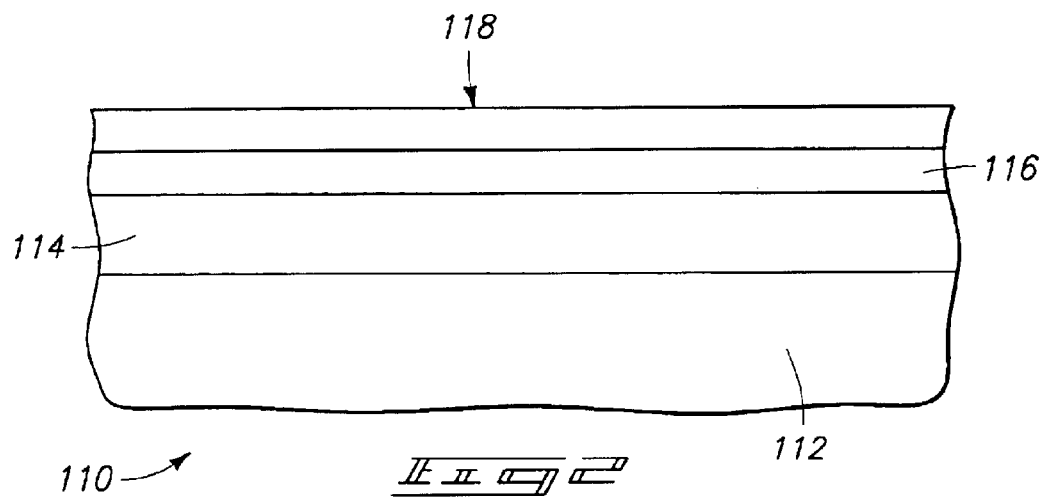
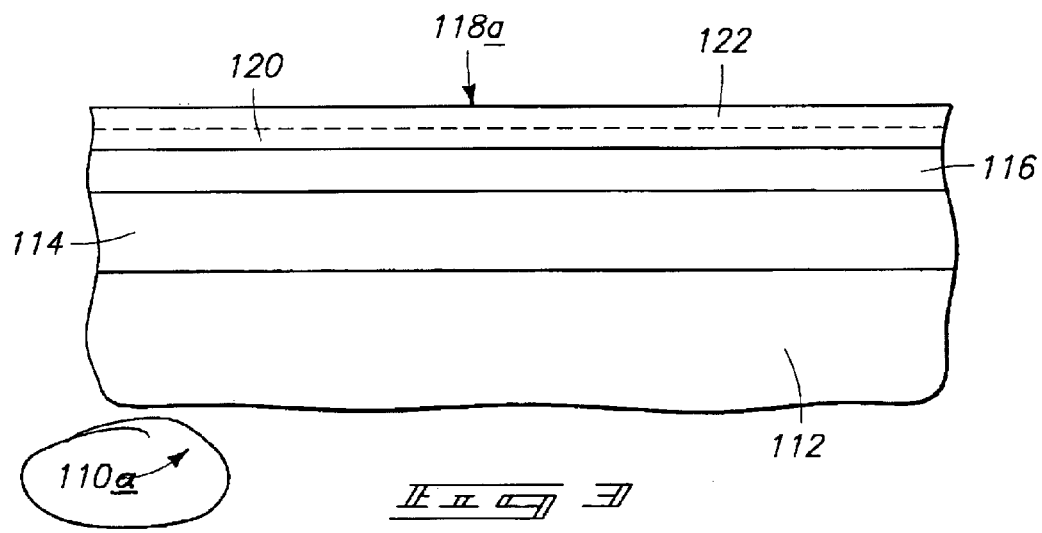

CHEMICAL VAPOR DEPOSITION METHODS OF FORMING BARIUM STRONTIUM TITANATE COMPRISING DIELECTRIC LAYERS

TECHNICAL FIELD

This invention relates to chemical vapor deposition methods of forming barium strontium titanate comprising dielectric layers, including such layers having varied concentration of barium and strontium within the layer.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants.

Highly integrated memory devices are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials (such as ferroelectric materials, perovskite materials and pentoxides) are commonly referred to as "high k" materials due to their high dielectric constants, which make them attractive as dielectric materials in capacitors, for example for high density DRAMs and non-volatile memories. Using such materials enables the creation of much smaller and simpler capacitor structures for a given stored charge requirement, enabling the packing density dictated by future circuit design. One such known material is barium strontium titanate.

SUMMARY

The invention comprises in one aspect a chemical vapor deposition method of forming a barium strontium titanate comprising dielectric layer. A substrate is positioned within a chemical vapor deposition reactor. Barium and strontium are provided within the reactor by flowing at least one metal organic precursor to the reactor. Titanium is provided within the reactor. At least one oxidizer is also flowed to the reactor under conditions effective to deposit a barium strontium titanate comprising dielectric layer on the substrate. In one implementation, the oxidizer comprises $H_2O$. In one implementation, the oxidizer comprises $H_2O_2$. In one implementation, the oxidizer comprises at least $H_2O$ and at least another oxidizer selected from the group consisting of $O_2$, $O_3$, $NO_x$, $N_2O$, and $H_2O_2$, where "x" is at least 1. In one implementation, the oxidizer comprises at least $H_2O_2$ and at least another oxidizer selected from the group consisting of $O_2$, $O_3$, $NO_x$, and $N_2O$, where "x" is at least 1.

BRIEF DESCRIPTION OF THE DRAWINGS

Preferred embodiments of the invention are described below with reference to the following accompanying drawings.

FIG. 2 a diagrammatic sectional view of a semiconductor wafer fragment in process in accordance with an aspect of the invention.

FIG. 3 is a diagrammatic sectional view of an alternate embodiment semiconductor wafer fragment in process in accordance with an aspect of the invention.

DETAILED DESCRIPTION OF THE PREFERRED EMBODIMENTS

Figure 1:
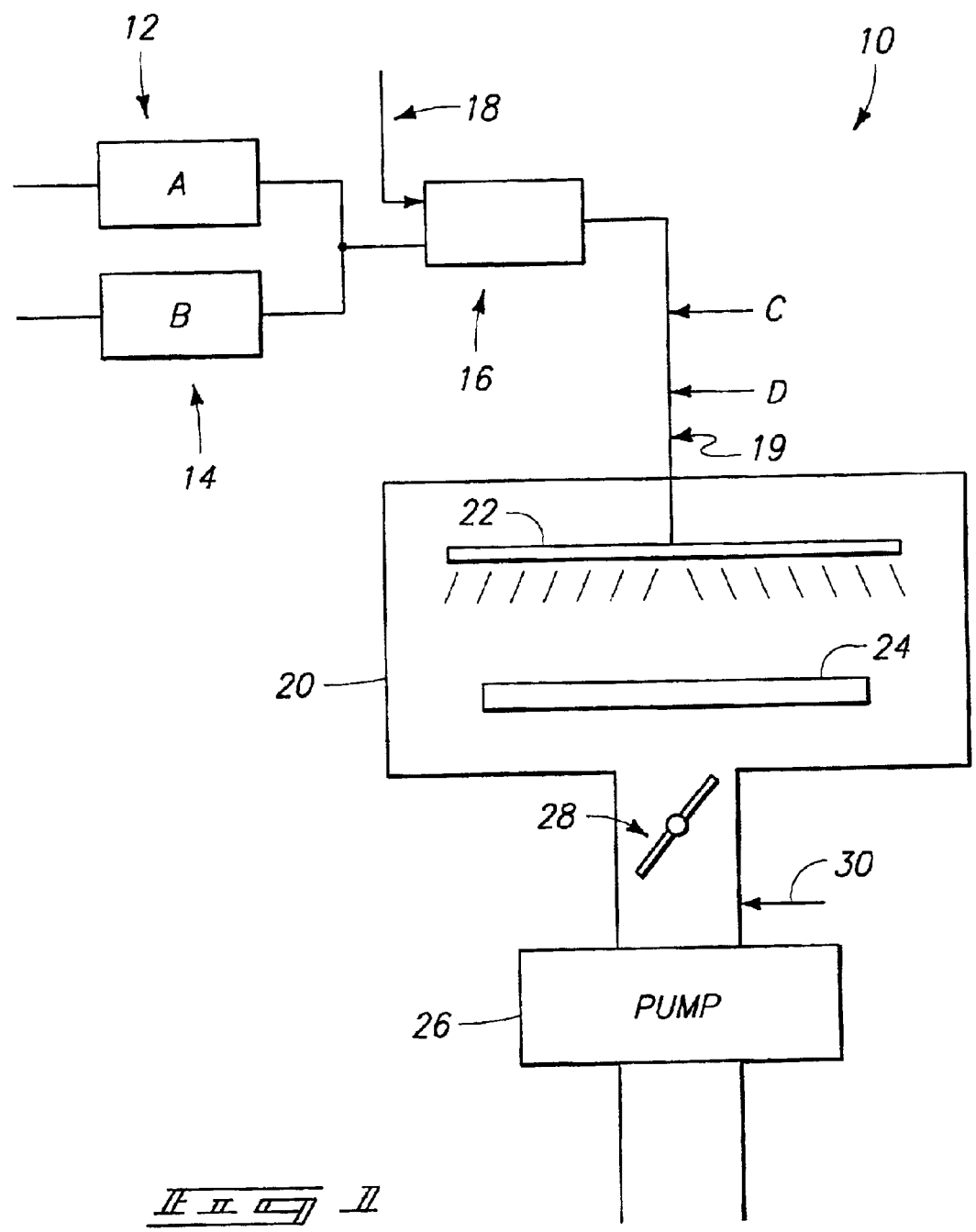
FIG. 1 is schematic diagram of an exemplary system usable in accordance with an aspect of the invention.

This disclosure of the invention is submitted in furtherance of the constitutional purposes of the U.S. Patent Laws "to promote the progress of science and useful arts" (Article 1, Section 8).

FIG. 1 diagrammatically illustrates but one chemical vapor deposition system 10 in accordance with but one implementation of a chemical vapor deposition method in accordance with an aspect of the invention. Such comprises an A precursor feed stream 12 and a B precursor feed stream 14. Such combine and feed to a vaporizer 16. An inert gas stream 18 can also be provided to vaporizer 16 to facilitate flow of the vaporized precursors to a downstream chamber.

A chemical vapor deposition chamber 20 is connected downstream of vaporizer 16. Such includes a showerhead 22 for receiving and distributing gaseous precursors therein. A suitable wafer holder 24 is received within chamber 20. Oxidizer gas feed streams, for example two oxidizer feed streams C and D, are preferably provided upstream of the showerhead. Further, an additional inert gas feed stream 19 is shown positioned between the oxidizer feed streams and chamber. More or less feed streams with or without mixing might also of course be utilized. The deposition is preferably conducted at subatmospheric pressure, with a vacuum pump 26 and an exemplary valve 28 being diagrammatically illustrated for achieving a desired vacuum pressure within chamber 20. Further, the deposition may or may not be plasma enhanced.

In one example, and by way of example only, the A stream consists essentially of a mixture of Ba and Sr precursors (i.e., preferably about 50%—50% by volume), and the B stream consists essentially of Ti precursor(s). Example preferred deposition is by metal organic chemical vapor deposition (MOCVD) processes, with at least one oxidizer being provided within chamber 20 with suitable MOCVD precursors to deposit a desired barium strontium titanate comprising dielectric layer. Example precursors, and by way of example only, include:

| | |
|---|---|
| $Ba(thd)_2$ | bis(tetramethylheptanedionate) |
| $Sr(thd)_2$ | bis(tetramethylheptanedionate) |
| $Ti(thd)_2(O-i-Pr)_2$ | (isopropoxide)bis(tetramethylheptanedionate) |
| $Ba(thd)_2$ | bis(tetramethylheptanedionate) |
| $Sr(thd)_2$ | bis(tetramethylheptanedionate) |
| $Ti(dmae)_4$ | bis(dimethylaminoethoxide) |
| $Ba(methd)_2$ | bis(methoxyethoxyte, tetramethylheptanedionate) |
| $Sr(methd)_2$ | bis(methoxyethoxyte, tetramethylheptanedionate) |
| $Ti(mpd)(thd)_2$ | bis(methylpentanediol, tetramethylheptanedionate) |
| $Ba(dpm)_2$ | bis(dipivaloylmethanato) |
| $Sr(dpm)_2$ | bis(dipivaloylmethanato) |
| $TiO(dpm)_2$ | (titanyl)bis(dipivaloylmethanato) |
| $Ba(dpm)_2$ | bis(dipivaloylmethanato) |
| $Sr(dpm)_2$ | bis(dipivaloylmethanato) |

-continued

| Ti(t-BuO)$_2$(dpm)$_2$ | (t-butoxy)bis(dipivaloylmethanato) |
| --- | --- |
| Ba(dpm)$_2$ | bis(dipivaloylmethanato) |
| Sr(dpm)$_2$ | bis(dipivaloylmethanato) |
| Ti(OCH$_3$)$_2$(dpm)$_2$ | (methoxy)bis(dipivaloylmethanato) |

Adducts (i.e., tetraglyme, trietherdiamine, pentamethyldiethlyenetriamine), solvents (i.e., butylacetate, methanol, tetrahydrofuran), and/or other materials might be utilized with the precursors. By way of example only, and where the precursors include metal organic precursors, example flow rates for the various of such precursors include anywhere from 10 mg/min. to 1000 mg/min. of liquid feed to any suitable vaporizer.

A first aspect of the invention is described in connection with a chemical vapor deposition method of forming a barium strontium titanate comprising dielectric layer having a varied concentration of barium and strontium within the layer. By way of example only, an exemplary implementation is described with reference to FIG. 2. FIG. 2 depicts an exemplary substrate 110 comprising a bulk monocrystalline silicon substrate 112. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. An insulative layer 114, such as borophosphosilicate glass (BPSG) by way of example only, is formed over substrate 112. A conductive capacitor electrode layer 116, such as platinum or an alloy thereof by way of example only, is formed over layer 114.

Such substrate is placed within a chemical vapor deposition reactor. Plasma, remote or within the chamber, might be utilized. Barium and strontium are provided within the reactor by flowing at least one metal organic precursor to the reactor. Titanium is also provided within the reactor. By way of example only, exemplary precursors are as described above. At least one oxidizer is also flowed to the reactor. Conditions are provided within the reactor effective to deposit a barium strontium titanate comprising dielectric layer 118 on the substrate. In one preferred embodiment, the barium and strontium are provided within the reactor by flowing at least two metal organic precursors to the reactor, with one of the precursors comprising barium, and another of the precursors comprising strontium. Such precursors might be fed to the reactor as separate flow streams, or as a mixture in a single flow stream, as depicted by FIG. 1 and described above with respect to stream 12.

In accordance with the invention, the oxidizer comprises at least one of H$_2$O or H$_2$O$_2$. Other oxidizers might also be utilized. In one aspect of the invention, the oxidizers comprise at least H$_2$O and at least another oxidizer selected from the group consisting of O$_2$, O$_3$, NO$_x$, N$_2$O, and H$_2$O$_2$, where "x" is at least 1. In one aspect of the invention, the oxidizers comprise at least H$_2$O$_2$ and at least another oxidizer selected from the group consisting of O$_2$, O$_3$, NO$_x$, and N$_2$O, where "x" is at least 1. Use of more than one of the another oxidizers is of course contemplated, as is use of additional oxidizers.

In the exemplary depicted FIG. 2 example, flow rate of the oxidizer(s) and flow rate of the metal organic precursor(s) are provided to the reactor under some suitable set of conditions effective to deposit a substantially homogenous barium strontium titanate layer 118.

Alternate processing could of course be utilized. FIG. 3 illustrates an alternate embodiment wafer fragment 110a. Like numerals from the first described embodiment are utilized where appropriate, with differences being indicated with the suffix "a" or with different numerals. Some aspect of the rate of flow of the precursor or the oxidizer(s) (i.e., the rate of flow of one or more oxidizers to the reactor) is changed to affect a change in relative atomic concentration of barium and strontium, for example to deposit a substantially homogenous second portion 122 of barium strontium titanate layer 118a. Accordingly regions 120 and 122 of layer 18 while constituting barium strontium titanate have different relative atomic ratios of barium and strontium. Ratios of barium to strontium in the deposited layer might vary anywhere from 1% to 99% barium versus strontium.

Additional and/or alternate preferred processing can occur in accordance with any of our co-pending U.S. patent application Ser. No. 09/476,516, filed on Jan. 3, 2000, entitled "Chemical Vapor Deposition Methods Of Forming A High K Dielectric Layer And Methods Of Forming A Capacitor", listing Cem Basceri as inventor; U.S. patent application Ser. No. 09/580,733, filed on May 26, 2000, entitled "Chemical Vapor Deposition Methods And Physical Vapor Deposition Methods", listing Cem Basceri as inventor; and U.S. patent application Ser. No. 09/905,320, filed concurrently herewith, entitled "Chemical Vapor Deposition Methods Of Forming Barium Strontium Titanate Comprising Dielectric Layers, Including Such Layers Having A Varied Concentration Of Barium And Strontium Within The Layer", listing Cem Basceri and Nancy Alzola as inventors. Each of these is hereby fully incorporated by reference.

Preferred total flows of the oxidizers include anywhere from 100 sccm to 4000 sccm, more preferably between 500 sccm and 2000 sccm, and more preferably between 750 sccm and 1250 sccm. Such flow rates are with respect to an Applied Materials Centura Frame processor. A preferred pressure range is from 100 mTorr to 20 Torr, with a range of from 1 Torr to 6 Torr believed to be most preferred. Susceptor temperature is preferably from 100° C. to 700° C., more preferably from 400° C. to 700° C., with less than or equal to 550° C. being even more preferred, particularly in obtaining continuity in the deposited layer at a thickness at or below 200 Angstroms, and preferably at least down to 50 Angstroms. Most preferably, the susceptor temperature is kept at less than or equal to 550° C. during all of the deposit to form the subject layer. An inert gas, such as Ar, is also preferably flowed to the reactor downstream of the oxidizer feeds, and preferably at substantially the same flow rate as the total oxidizer flow rate.

It is expected that H$_2$O$_2$ would be a stronger oxidizer as compared to H$_2$O. Without being limited by any theory, it is expected that both H$_2$O and H$_2$O$_2$ will form OH$^-$ during deposition conditions for BST films. Although OH$^-$ will behave differently than other oxidizers (such as O$_3$, NO, O$_2$, and N$_2$O) in the presence of BST precursors, its effect is expected to mild and similar to N$_2$O. By way of example only, and not in any way by way of limitation, use of H$_2$O and/or H$_2$O$_2$ as sole oxidizers is expected to increase the atomic percent of titanium in the titanate, and reduce the deposition rate as compared to a 50:50 volumetric ratio control feed of O$_2$ and N$_2$O as oxidizers. Use of a) O$_2$ and, b) H$_2$O and/or H$_2$O$_2$ in combination in a 1:1 volumetric ratio is expected to decrease titanium incorporation in the titanate, and increase the deposition rate. Utilization of a) O$_3$ and, b)

$H_2O$ and/or $H_2O_2$ is also expected to increase the titanium incorporation in the titanate, but reduce the deposition rate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chemical vapor deposition method of forming a barium strontium titanate comprising dielectric layer, comprising:

positioning a substrate within a chemical vapor deposition reactor; and simultaneously a) providing gaseous barium and strontium within the reactor by flowing at least one metal organic precursor to the reactor, b) providing gaseous titanium within the reactor, and c) flowing at least one gaseous oxidizer comprising $H_2$ to the reactor under conditions effective to deposit a barium strontium titanate comprising dielectric layer on the substrate; and during the flowing at least one gaseous oxidizer, changing a flow rate of one or more oxidizers to produce a non-homogenous ratio of barium relative to strontium within the dielectric layer.

2. The method of claim 1 comprising flowing another inorganic oxidizer to the reactor during the deposit.

3. The method of claim 1 wherein the conditions comprise receipt of the substrate by a susceptor, the susceptor having a temperature of less than or equal to 550° C.

4. The method of claim 1 wherein the at least one metal organic precursor comprises a member selected from the group consisting of $Ba(thd)_2$, $Sr(thd)_2$, $Ba(methd)_2$, $Sr(methd)_2$, $Ba(dpm)_2$, and $Sr(dpm)_2$.

5. The method of claim 1 wherein the providing gaseous titanium within the reactor comprises flowing at least one member of the group consisting of $Ti(dmae)_4$, $Ti(thd)_2(O\text{-}i\text{-}Pr)_2$, $TiO(dpm)_2$, $Ti(t\text{-}BuO)_2(dpm)_2$, and $Ti(OCH_3)_2(dpm)_2$.

6. A chemical vapor deposition method of forming a barium strontium titanate comprising dielectric layer, comprising:

positioning a substrate within a chemical vapor deposition reactor;

simultaneously a) providing gaseous barium and strontium within the reactor by flowing at least one metal organic precursor to the reactor, b) providing gaseous titanium within the reactor, and C) flowing at least one gaseous oxidizer comprising $H_2O_2$ to the reactor under conditions effective to deposit a barium strontium titanate comprising dielectric layer on the substrate; and adjusting the flow of the at least one gaseous oxidizer to produce a first portion of the dielectric layer comprising a first ratio of barium relative to strontium, and a second portion of the dielectric layer having a second ratio of barium relative to strontium, the first ratio differing from the second ratio.

7. The method of claim 6 comprising flowing another inorganic oxidizer to the reactor during the deposit.

8. The method of claim 6 wherein the conditions comprise receipt of the substrate by a susceptor, the susceptor having a temperature of less than or equal to 550°C.

9. The method of claim 6 wherein the at least one metal organic precursor comprises a member selected from the group consisting of $Ba(thd)2$, $Sr(thd)_2$, $Ba(methd)_2$, $Sr(methd)_2$, $Ba(dpm)_2$, and $Sr(dpm)_2$.

10. The method of claim 6 wherein the providing gaseous titanium within the reactor comprises flowing at least one member of the group consisting of $Ti(dmae)_4$, $Ti(thd)_2(O\text{-}i\text{-}Pr)_2$, $TiO(dpm)_2$, $Ti(t\text{-}BuO)_2(dpm)_2$, and $Ti(t\text{-}OCH_3)_2(dpm)_2$.

* * * * *

UNITED STATES PATENT AND TRADEMARK OFFICE
CERTIFICATE OF CORRECTION

PATENT NO. : 6,838,122 B2
DATED : January 4, 2005
INVENTOR(S) : Basceri et al.

It is certified that error appears in the above-identified patent and that said Letters Patent is hereby corrected as shown below:

<u>Title page,</u>
Item [56], References Cited, U.S. PATENT DOCUMENTS, insert the following:

| | | |
|---|---|---|
| -- 4,261,698 A | 04/1981 | Carr et al. |
| 4,691,662 A | 09/1987 | Roppel et al. |
| 5,261,961 A | 11/1993 | Takasu et al. |
| 5,270,241 A | 12/1993 | Dennison et al. |
| 5,312,783 A | 05/1994 | Takasaki et al. |
| 5,392,189 A | 02/1995 | Fazan et al. |
| 5,395,771 A | 03/1995 | Nakato |
| 5,468,687 A | 11/1995 | Carl et al. |
| 5,525,156 A | 06/1996 | Manada et al. |
| 5,614,018 A | 03/1997 | Azuma et al. |
| 5,656,329 A | 08/1997 | Hampden-S |
| 5,663,089 A | 09/1997 | Tomozawa et al. |
| 5,702,562 A | 12/1997 | Wakahara |
| 5,719,417 A | 02/1998 | Roeder et al. |
| 5,723,361 A | 03/1998 | Azuma et al. |
| 5,736,759 A | 04/1998 | Haushaalter |
| 5,976,990 A | 11/1999 | Mercaldi et al. |
| 5,989,927 A | 11/1999 | Yamonobe |
| 6,215,650 | 04/2001 | Gnade et al. |
| 6,258,654 | 07/2001 | Gocho |
| 6,287,935 B1 | 09/2001 | Coursey |
| 6,325,017 B1 | 12/2001 | DeBoer et al. |
| 6,335,049 B1 | 01/2002 | Basceri -- . |

UNITED STATES PATENT AND TRADEMARK OFFICE
CERTIFICATE OF CORRECTION

PATENT NO. : 6,838,122 B2
DATED : January 4, 2005
INVENTOR(S) : Basceri et al.

It is certified that error appears in the above-identified patent and that said Letters Patent is hereby corrected as shown below:

<u>Title page (cont'd),</u>
FOREIGN PATENT DOCUMENTS, insert the following:

| | | |
|---|---|---|
| -- EP | 0 030 798 | 06/1981 |
| GB | 2 194 555 A | 03/1988 |
| EP | 0 306 069A2 | 03/1989 |
| EP | 0 388 957A2 | 09/1990 |
| JP | 2250970 | 10/1990 |
| JP | 04-24922 | 01/1992 |
| JP | 04-115533 | 04/1992 |
| JP | 04-180566 | 06/1992 |
| JP | 08-060347 | 03/1996 |
| EP | 0 810 666A1 | 12/1997 |
| EP | 0 892 426A2 | 01/1999 |
| JP | 2000091333 | 03/2000 |
| WO | 01/16395 | 03/2001 --. |

UNITED STATES PATENT AND TRADEMARK OFFICE
CERTIFICATE OF CORRECTION

PATENT NO. : 6,838,122 B2
DATED : January 4, 2005
INVENTOR(S) : Basceri et al.

It is certified that error appears in the above-identified patent and that said Letters Patent is hereby corrected as shown below:

Title page (cont'd),
OTHER DOCUMENTS, insert the following:

-- Aoyama et al., Leakage Current Mechanism of Amorphous and Polycrystalline Ta2O5 Films Grown by Chemical Vapor Deposition, 143 J. ELECTROCHEM SOC., No. 3, pp 977-983 (March 1996).

Stemmer et al., Accommodation of nonstoichiometry in (100) fiber-textured (BaxSr1-x)Ti1+yO3+z thin films grown by chemical vapor deposition, 74 APPL. PHYS. LETT., No. 17, pp. 2432-2434 (26 April 1999).

Streiffer et al., Ferroelectricity in thin films: The dielectric response of fiber-textured (BaxSr1-x)Ti1+yO3+z thin films grown by chemical vapor deposition, 86 J. APPL. PHYS. No. 8, pp. 4565-4575 (15 October 1999).--

Signed and Sealed this

Eighth Day of November, 2005

JON W. DUDAS
*Director of the United States Patent and Trademark Office*